(12) United States Patent
Kobayashi

(10) Patent No.: US 6,229,172 B1
(45) Date of Patent: May 8, 2001

(54) SEMICONDUCTOR DEVICE AND MANUFACTURING METHOD THEREOF

(75) Inventor: Heiji Kobayashi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/192,461

(22) Filed: Nov. 16, 1998

(30) Foreign Application Priority Data

Jun. 1, 1998 (JP) .................................................. 10-151415

(51) Int. Cl.⁷ .................................................. H01L 29/72
(52) U.S. Cl. .................. 257/298; 257/300; 257/309; 257/390; 257/532
(58) Field of Search .................. 257/390, 298, 257/300, 309, 532

(56) References Cited

U.S. PATENT DOCUMENTS

| 5,332,687 | 7/1994 | Kuroda . |
| 5,488,007 | * 1/1996 | Kim et al. ............................. 257/390 |

FOREIGN PATENT DOCUMENTS 8-023033    1/1996   (JP) .

* cited by examiner

Primary Examiner—Edward Wojciechowicz
(74) Attorney, Agent, or Firm—McDermott, Will & Emery

(57) ABSTRACT

A semiconductor device having a gentle step between a memory cell array region and a peripheral region is provided, in which the resist at this portion can be prevented from being reduced in thickness. The semiconductor device includes a memory cell block having a plurality of capacitors and formed on the main surface of a silicon substrate. An outer surface of the end portion of the capacitor in the memory cell block has an upper surface extending at a first height above the main surface of the silicon substrate, and contiguous with the upper surface, a bottom surface extending at a second height lower than the first height above the main surface of the silicon substrate.

14 Claims, 23 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly to a structure of a DRAM (Dynamic Random Access Memory) and a method of manufacturing the same.

2. Description of the Background Art

In recent years, there has been a rapidly increasing demand for semiconductor devices owing to wide spread of information equipment such as computers. In terms of functionality, devices having a larger storage capacity and a high-speed operability have been demanded. To this end, technical development has been proceeded for attaining higher degree of integration and higher response or reliability of semiconductor devices.

Among the semiconductor devices, a DRAM is well-known as a kind permitting random input/output of storage information. The DRAM is formed of a memory cell array region, which is a storage region for storing a large amount of storage information, and a peripheral region necessary for external input and output.

In the DRAM having such a structure, the memory cell array region occupies a large area, and has a plurality of memory cells arranged in a matrix each for storing unit storage information. A memory cell generally consists of one MOS (Metal Oxide Semiconductor) transistor and one capacitor connected thereto, and thus is well-known as a one-transistor and one-capacitor type memory cell.

In the following, a configuration of a conventional DRAM will be described by way of example. FIG. 20 is a top plan view showing a configuration of a conventional DRAM. Referring to FIG. 20, the conventional DRAM includes a memory cell block 504 with a memory capacitor region 504b and a dummy capacitor region 504a, as a memory cell array region, and a word line contact portion 505 and a sense amplifier contact portion 506 together as a peripheral region. Word line contact portion 505 and sense amplifier contact portion 506 surround memory cell block 504.

In memory cell block 504, a plurality of capacitors 521a, 522a, 523a, 531a, 532b, 533b, 541a, 542b and 543b are formed in a matrix, and the capacitors have respective lower electrodes 621a, 622a, 623a, 631a, 632b, 633b, 641a, 642b and 643b therein.

Capacitors 532b, 533b, 542b and 543b in memory capacitor region 504b are involved in storing information. On the other hand, capacitors 521a, 522a, 523a, 531a and 541a in dummy capacitor region 504a which is adjacent to word line contact portion 505 and sense amplifier contact portion 506 forming a peripheral region take no part in storing information. The capacitors in the peripheral portion of memory cell block 504 are not used for storing information, because those capacitors may not be formed as designed due to discontinuity of minute repetitive patterns or to the presence of steps.

In word line contact portion 505, an interconnection 572 to be connected to a word line is formed extending in one direction, which is electrically connected to the semiconductor substrate through a contact hole 554.

FIG. 21 is a cross sectional view taken along the line XXI—XXI in FIG. 20. With reference to FIG. 21, a plurality of MOS transistors (not shown) are formed on the surface 511a of a silicon substrate 511. Formed to cover the MOS transistors is an interlayer insulating film 512, which is provided with contact holes 513 and 514.

On the surface 512a of interlayer insulating film 512, lower electrodes 632b and 621a of the capacitors are formed to fill in respective contact holes 513 and 514. A dielectric film 551 is formed to cover lower electrodes 621a and 632b, and to cover dielectric film 551, an upper electrode 552 of the capacitors is formed. Another interlayer insulating film 553 is formed to cover upper electrode 552.

Here, lower electrode 621a has a relatively high side surface 521b, and therefore a step 553a is inevitably created in interlayer insulating film 553 in the vicinity of the side surface 521b. A contact hole 554 is provided through interlayer insulating films 553 and 512, and an interconnection 572 is provided on interlayer insulating film 553 to fill in contact hole 554.

A method of manufacturing the semiconductor device (DRAM) shown in FIGS. 20 and 21 will now be described. FIG. 22 is a top plan view showing a manufacturing process of a conventional semiconductor device (DRAM) as shown in FIGS. 20 and 21. FIG. 23 is a cross sectional view taken along the line XXIII—XXIII in FIG. 22.

Referring to FIGS. 22 and 23, a plurality of MOS transistors (not shown) are first formed on silicon substrate 511. Formed to cover these MOS transistors is an interlayer insulating film 512, and on which film a resist pattern is formed. Interlayer insulating film 512 is then etched according to this resist pattern to form contact holes 513 and 514.

Doped polycrystalline silicon (polysilicon) is deposited to fill in contact holes 513 and 514 and to cover interlayer insulating film 512. This doped polysilicon is etched according to a resist pattern formed thereon, and thus lower electrodes 621a, 622a, 623a, 631a, 632b, 633b, 641a, 642b and 643b are formed. Note that lower electrode 621a of the capacitor in this case has a side surface 521b of which height ($h_0$ in FIG. 23) is about 700 nm.

A dielectric film is formed to cover these lower electrodes, which is made of a silicon nitride oxide film with a film thickness of about 7 nm. On this dielectric film, a conductive film is formed, which is made of doped polysilicon about 150 nm thick. A resist pattern is formed on the conductive film, and the conductive film as well as the dielectric film are etched according to this resist pattern to form upper electrodes 552 of the capacitors and dielectric film 551.

An interlayer insulating film 553 is formed to cover upper electrode 552. At this time, a step 553a results in interlayer insulating film 553 in the vicinity of the side surface 521b of lower electrode 621a. A resist pattern 574 having a hole pattern 574a is then formed to cover interlayer insulating film 553. Here, memory cell block 504 becomes higher in level than word line contact portion 505 and sense amplifier contact portion 506. Accordingly, the resist for making the resist pattern 574 flows from memory cell block 504 down to word line contact portion 505 and sense amplifier contact portion 506.

Specifically, as shown in FIG. 22, the resist provided on capacitors 521a, 522a, 523a, 531a and 541a located at the portion adjacent to word line contact portion 505 and sense amplifier contact portion 506 forming the peripheral region flows in the direction shown by arrows 521c, 521d, 521e, 522c, 523c, 531c and 541c.

In particular, the resist on capacitor 521a located at a corner of the matrix will flow mainly in three directions as shown by arrows 521c, 521d and 521e, and therefore the thickness of the resist in this portion ($t_1$ in FIG. 23) will become especially thin, which is about 400 nm.

With reference to FIGS. 20 and 21, interlayer insulating films 553 and 512 are etched according to resist pattern 574 to form a contact hole 554. Doped polysilicon is deposited to fill in contact hole 554 as well as to cover the surface of interlayer insulating film 553. The doped polysilicon is then etched according to a resist pattern formed thereon, and an interconnection 572 is formed. The DRAM shown in FIGS. 20 and 21 is thus completed.

FIG. 24 is a cross sectional view illustrating a problem which will arise during the manufacturing process as described above. Referring to FIG. 24, when etching interlayer insulating films 553 and 512 according to resist pattern 574, the resist pattern 574 itself will also be etched away. In this case, on a portion where the thickness of the resist pattern 574 is thin (the portion having the thickness $t_1$ (=400 nm) shown in FIG. 23), there may be no resist remained during etching, causing interlayer insulating film 553 to be exposed.

Interlayer insulating film 553 thus exposed will be etched away, which may cause a portion 552a of upper electrode 552 to be exposed. If a conductive layer is formed on this upper electrode 552 with the portion 552a thus being exposed, the upper electrode 552 will be short-circuited with the other conductive layer, which leads to decrease in the yield of the semiconductor devices.

SUMMARY OF THE INVENTION

The present invention is directed to solve the above-mentioned problems, and accordingly, an object of the invention is to provide a semiconductor device in which the step between the memory cell array region and the peripheral region is made gentle so as to prevent the resist from being reduced in thickness at this portion, as well as to provide a method of manufacturing the same.

The semiconductor device according to the present invention includes a semiconductor substrate having a main surface, a memory cell array region having a plurality of capacitors formed on the main surface of the semiconductor substrate, and a peripheral region surrounding the memory cell array region. An outer surface of the end portion of the capacitor in the memory cell array region adjacent to the peripheral region consists of a first surface and a second surface. The first surface extends at a first height above the main surface of the semiconductor substrate. The second surface, contiguous with the first surface, extends at a second height lower than the first height above the main surface of the semiconductor substrate.

In the semiconductor device configured as described above, the first surface and the second surface lower than the first surface are formed as the outer surface of the end portion of the capacitor in the memory cell array region adjacent to the peripheral region, whereby the end portion of the capacitor has a stairlike or sloped pattern. Accordingly, the inclination of the step at the end portion of the capacitor becomes less steep than in the absence of the second surface. As a result, any layer formed on this step will have a gradual slope, and the film thickness of a resist coated thereon will be prevented from becoming thin.

Preferably, an interlayer insulating film is further provided to cover the first and second surfaces of the capacitor. In this case, although a step will be created in the interlayer insulating film, the inclination of the step will be gradual. Accordingly, when coating the step with a resist, the film thickness of the resist can be prevented from becoming thin.

The plurality of capacitors are arranged in a matrix, and the capacitors in the memory cell array region adjacent to the peripheral region are preferably located at the corners of the matrix. In this case, a second surface is created at each capacitor at each corner of the matrix from which the resist is especially easy to flow away, so that the inclination of the step at each corner can be made less steep. As a result, the film thickness of the resist coated on this step can be avoided to become thin.

The memory cell array region includes a capacitor region involved in storing information and a dummy capacitor region surrounding the capacitor region taking no part in storing information. Capacitors in the memory cell array region adjacent to the peripheral region are preferably formed in the dummy capacitor region. In this case, a second surface is formed in a capacitor in the memory cell array region adjacent to the peripheral region. Although it may cause decrease in its capability of storing information, the capacitor having the second surface formed therein is located in the dummy capacitor region, thus not involved in storing information. It means that, even though the storage capacity is decreased due to the formation of the second surface, the storage capacity for the overall memory cell array will not be decreased.

A capacitor includes a lower electrode formed on the main surface of the semiconductor substrate, a dielectric film formed on the surface of the lower electrode, and an upper electrode formed on the surface of the dielectric film. Preferably, the first surface is the surface of the upper electrode and the second surface is the surface of the lower electrode.

The manufacturing method of the semiconductor device according to the present invention, which is a manufacturing method of a semiconductor device having a memory cell array region and a peripheral region surrounding the memory cell array region, includes the steps of:

(1) forming a plurality of lower electrodes on the main surface of a semiconductor substrate;

(2) forming a dielectric film on the surface of the plurality of lower electrodes;

(3) forming a conductive film on the surface of the dielectric film; and (4) etching the conductive film and the dielectric film to form a plurality of capacitors each including the lower electrode, the dielectric film left on the surface of the lower electrode, and an upper electrode formed on the surface of the left dielectric film, and having a first surface extending at a first height above the main surface of the semiconductor substrate, and further etching the lower electrode of the capacitor formed in the memory cell array region adjacent to the peripheral region to form in the lower electrode a second surface contiguous with the first surface and extending at a second height lower than the first height above the main surface of the semiconductor substrate.

In the manufacturing method of the semiconductor device including the steps as described above, a first surface and a second surface located at a portion lower than the first surface are formed in the capacitor in the memory cell array region adjacent to the peripheral region, whereby there is provided a stairlike or sloped pattern between the memory cell array region and the peripheral region. Accordingly, the inclination of the step between the memory cell array region and the peripheral region becomes less steep than in the absence of the second surface, and thus the inclination of a layer formed on this stepped portion also becomes gradual. As a result, when this portion is coated with a resist, a sufficient film thickness of the resist can be guaranteed.

In addition, according to this method, the lower electrode is etched along with the conductive film and the dielectric film, and therefore there is no need to add another step compared to the conventional manufacturing method in which the conductive film and the dielectric film are etched.

Preferably, the manufacturing method according to this invention further includes a step of forming an interlayer insulating film to cover capacitors in the memory cell array region adjacent to the peripheral region. In this case, there exist a first surface and a second surface located at a portion lower than the first surface in the stepped portion between the peripheral region and the memory cell array region. Accordingly, when this stepped portion is covered with the interlayer insulating film, the film will have a gradual slope.

Preferably, the method further includes the step of forming a resist pattern on the interlayer insulating film and the step of etching the interlayer insulating film with the resist pattern. In this case, since the inclination of the interlayer insulating film is gradual, it is possible to prevent the film thickness of the resist forming the resist pattern from becoming thin. Therefore, during etching of the interlayer insulating film according to this resist pattern, the interlayer insulating film will not be exposed owing to the presence of the resist with such a sufficient thickness and therefore a desired pattern can be formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
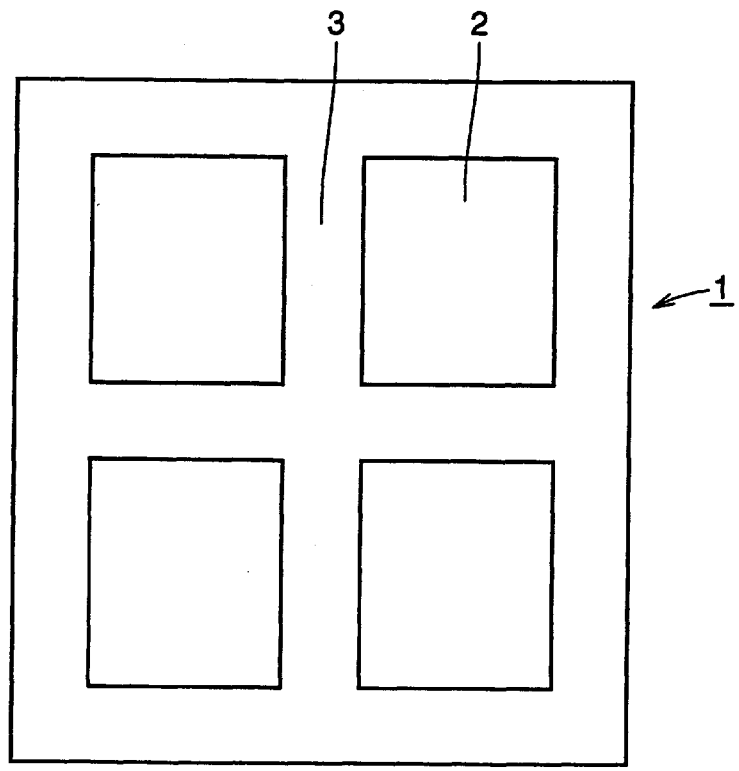
FIG. 1 is a top plan view of a semiconductor device according to a first embodiment of the present invention.

Referring to FIG. 1, a DRAM 1 includes a memory cell array portion 2 and a peripheral circuit portion 3. Memory cell array portion 2 has a portion involved in storing information. Peripheral circuit portion 3, having a circuit for transmitting an electric signal to memory cell array portion 2, is formed to surround the memory cell array portion 2.

Figure 2:
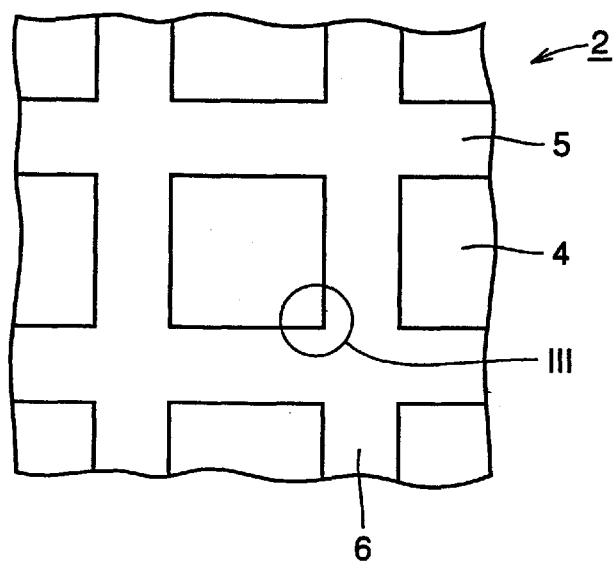
Fig. 2 is an enlarged top plan view showing a memory cell array portion.

With reference to FIG. 2, memory cell array portion 2 has a memory cell block 4 as a memory cell array region, and a word line contact portion 5 and a sense amplifier contact portion 6 together as a peripheral region. Word line contact portion 5 and sense amplifier contact portion 6 surrounding memory cell block 4 are provided for transmitting the electric signal to memory cell block 4, and are formed in a grid pattern.

Figure 3:
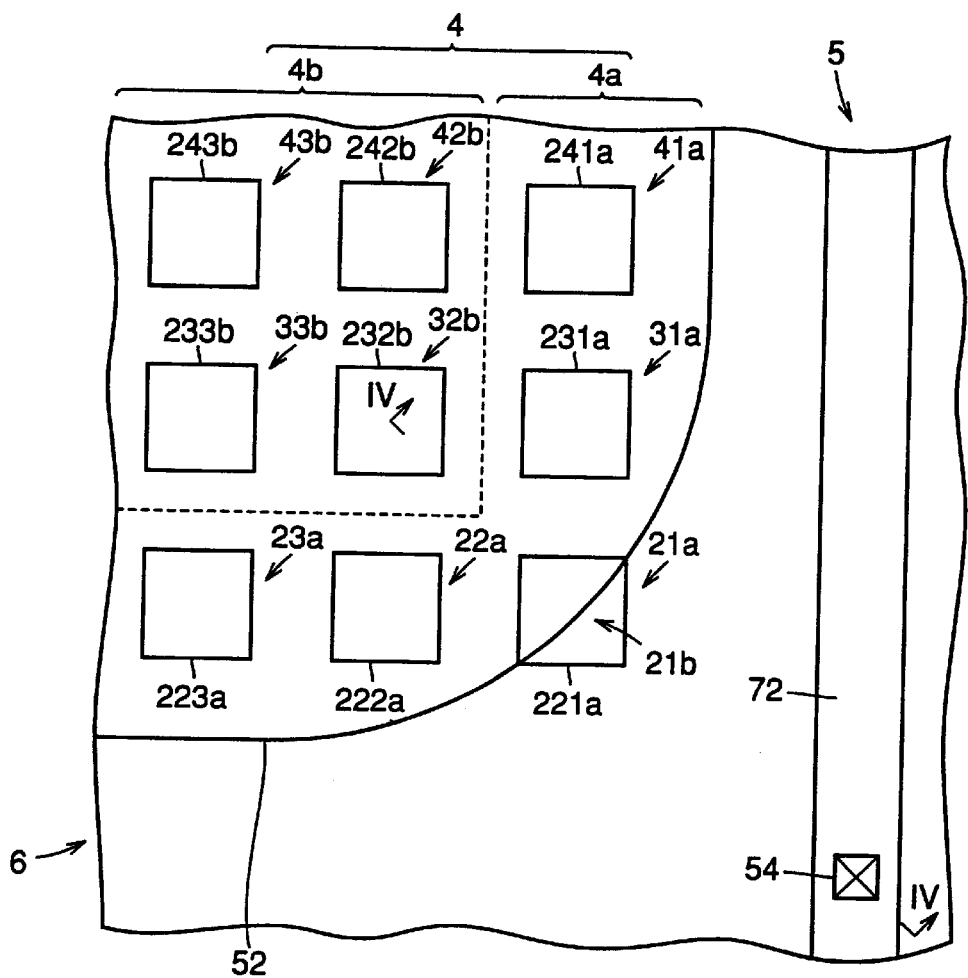
FIG. 3 is an enlarged top plan view showing a portion denoted by the circle III in FIG. 2.

Referring to FIG. 3, memory cell block 4 surrounded by word line contact portion 5 and sense amplifier contact portion 6 has a dummy capacitor region 4a and a memory capacitor region 4b. Memory capacitor region 4b is involved in storing information, whereas dummy capacitor region 4a takes no part in storing information. Dummy capacitor region 4a is provided between memory capacitor region 4b and word line contact portion 5 and sense amplifier contact portion 6. In other words, it is provided in a portion within memory cell block 4 adjacent to the peripheral region.

Formed in memory capacitor region 4b of memory cell block 4 are capacitors 32b, 33b, 42b and 43b capable of storing charges for storing information. In dummy capacitor region 4a of memory cell block 4, capacitors 21a, 22a, 23a, 31a and 41a are formed, which are not involved in storing information. Capacitors 21a, 22a, 23a, 31a, 32b, 33b, 41a, 42b and 43b are arranged in a matrix, each having lower electrodes 221a, 222a, 223a, 231a, 232b, 233b, 241a, 242b and 243b therein, respectively.

Capacitor 21a located at a corner of the matrix has a notch 21b formed therein.

On these capacitors, an upper electrode 52 is formed with a dielectric film (not shown in FIG. 3) interposed therebetween. Formed on upper electrode 52 is an interlayer insulating film, in which a contact hole 54 is formed. An interconnection 72 is formed to fill in contact hole 54 and to extend in one direction.

Figure 4:
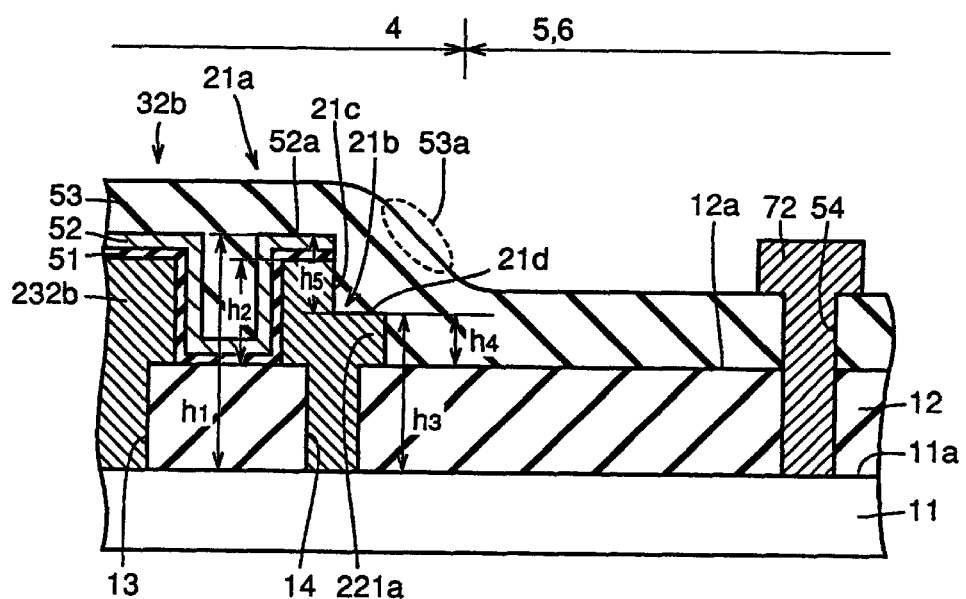
FIG. 4 is a cross sectional view taken along the line IV—IV in FIG. 3.

With reference to FIG. 4, MOS transistors (not shown) are formed on the main surface 11a of a silicon substrate 11. Formed to cover these MOS transistors is an interlayer insulating film 12 made of a silicon oxide film with a thickness of about 800 nm. Interlayer insulating film 12 has contact holes 13 and 14 therein.

Capacitors 32b and 21a are formed on interlayer insulating film 12. Capacitor 32b, which is electrically connected to silicon substrate 11, has a lower electrode 232b formed of doped polycrystalline silicon (polysilicon); a dielectric film 51 made of a silicon nitride oxide film covering the lower electrode 232b; and an upper electrode 52 formed of doped polysilicon covering the dielectric film 51.

Capacitor 21a is electrically connected to silicon substrate 11 and has a lower electrode 221a formed of doped polysilicon, a dielectric film 51 covering a part of the lower electrode 221a, and an upper electrode 52 covering the dielectric film 51. Dielectric film 51 has a film thickness of about 10 nm, and upper electrode 52 is about 100 nm thick. Upper electrode 52 has an upper surface 52a as a first surface which extends at a first height above the main surface 11a of silicon substrate 11.

Capacitor 21a has a notch 21b, which consists of a side surface 21c and a bottom surface 21d as a second surface. Bottom surface 21d, which continues through side surface 21c to upper surface 52a, extends at a second height lower than the first height above the main surface 11a of silicon substrate 11.

The first height ($h_1$ in FIG. 4) from the main surface 11a of silicon substrate 11 to upper surface 52a is about 1610 nm. The height ($h_2$ in FIG. 4) from the surface 12a of interlayer insulating film 12 to the upper surface of lower electrode 221a is about 700 nm. The second height ($h_3$ in FIG. 4) from the main surface 11a of silicon substrate 11 to bottom surface 21d is about 1150 nm. The height ($h_4$ in FIG. 4) from the surface 12a of interlayer insulating film 12 to bottom surface 21d and the height ($h_5$ in FIG. 4) from the bottom surface 21d to upper surface 52a are about 350 nm and about 460 nm, respectively.

Formed to cover capacitors 21a and 32b is an interlayer insulating film 53 made of a silicon oxide film. There exists a step 53a in interlayer insulating film 53 at a portion above notch 21b. A contact hole 54 is formed through interlayer insulating films 53 and 12. An interconnection 72 is formed on interlayer insulating film 53, filling in contact hole 54.

In the semiconductor device configured as described above, capacitor 21a in memory cell block 4 located adjacent to word line contact portion 5 and sense amplifier contact portion 6 has a stairlike pattern. In other words, bottom surface 21d as a second surface exists between upper surface 52a of upper electrode 52 and surface 12a of interlayer insulating film 12. Accordingly, when this capacitor 21a is covered with interlayer insulating film 53, the inclination of step 53a created in interlayer insulating film 53 becomes gradual. When interlayer insulating film 53 is coated with a resist, variation in the film thickness of the resist can thus be suppressed compared as in the prior art. Therefore, interlayer insulating film 53 is prevented from being exposed when it is etched using the resist as a mask.

A manufacturing method of the semiconductor device shown in FIGS. 3 and 4 will now be described.

Figure 5:
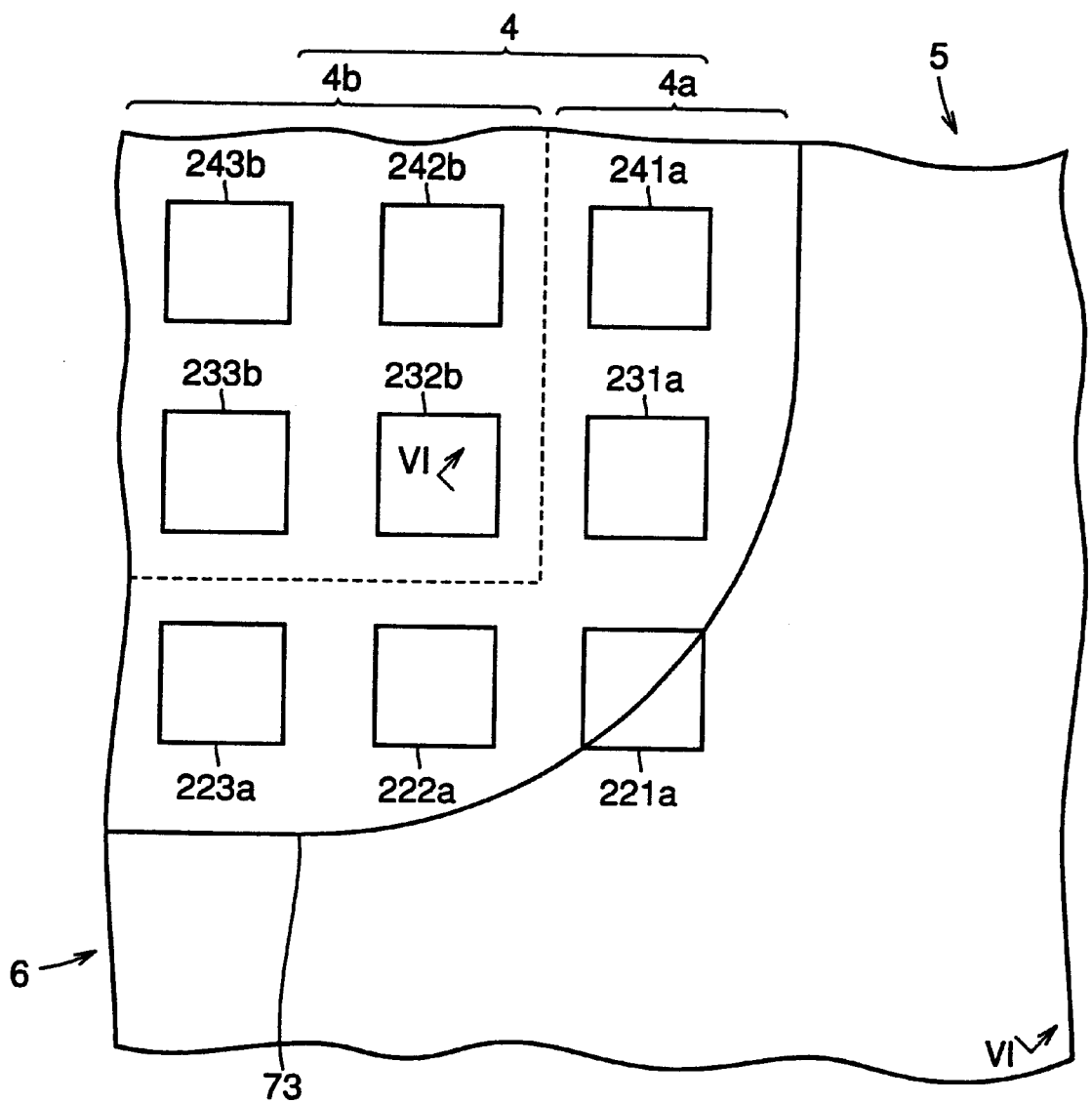
FIG. 5 is a top plan view showing the first step of a manufacturing method of the semiconductor device shown in FIGS. 3 and 4.
Figure 6:
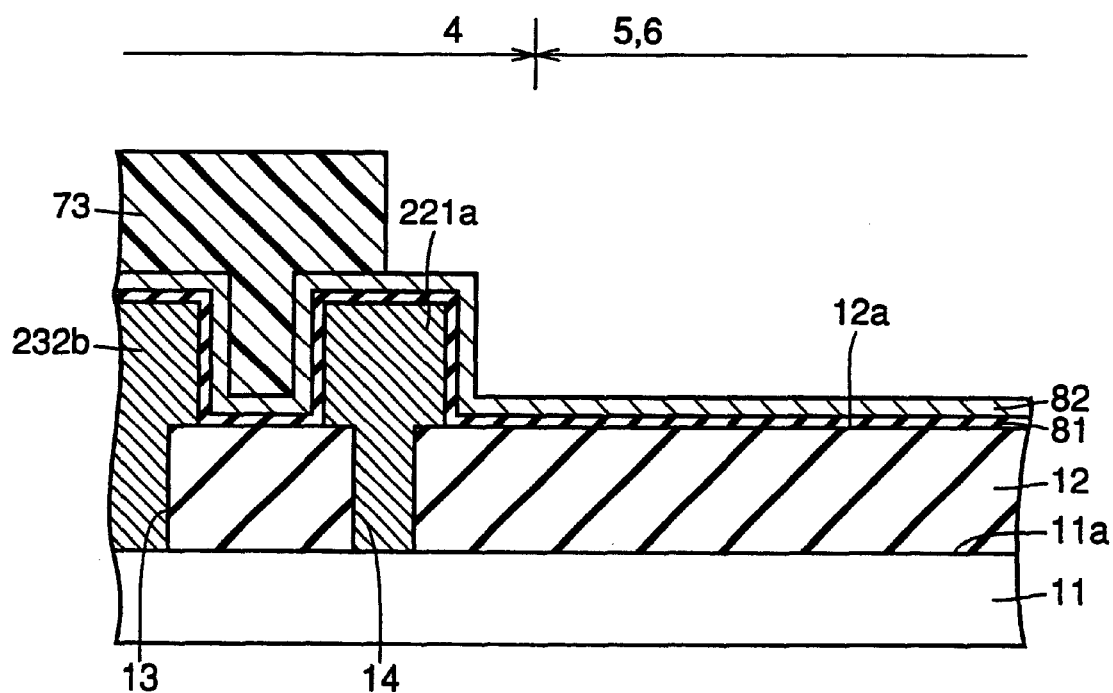
FIG. 6 is a cross sectional view taken along the line VI—VI in FIG. 5.

With reference to FIGS. 5 and 6, an interlayer insulating film 12 is formed on the main surface 11a of silicon substrate 11 by CVD (Chemical Vapor Deposition), which film is made of a silicon oxide film with a thickness of about 800 nm. A resist pattern is formed on interlayer insulating film 12, and by etching interlayer insulating film 12 according to this resist pattern, contact holes 13 and 14 are formed.

Doped polysilicon is deposited by CVD to fill in contact holes 13 and 14, and to cover surface 12a of interlayer insulating film 12. By forming a resist pattern on doped polysilicon and etching the doped polysilicon with this resist pattern, lower electrodes 221a, 222a, 223a, 231a, 232b, 233b, 241a, 242b and 243b are formed, and to cover these lower electrodes, a silicon nitride oxide film 81 with a film thickness of about 10 nm is formed by CVD. A doped polysilicon film 82 about 100 nm in thickness is formed on silicon nitride oxide film 81 by CVD. On doped polysilicon film 82 is formed a resist pattern 73 having a prescribed pattern.

Figure 7:
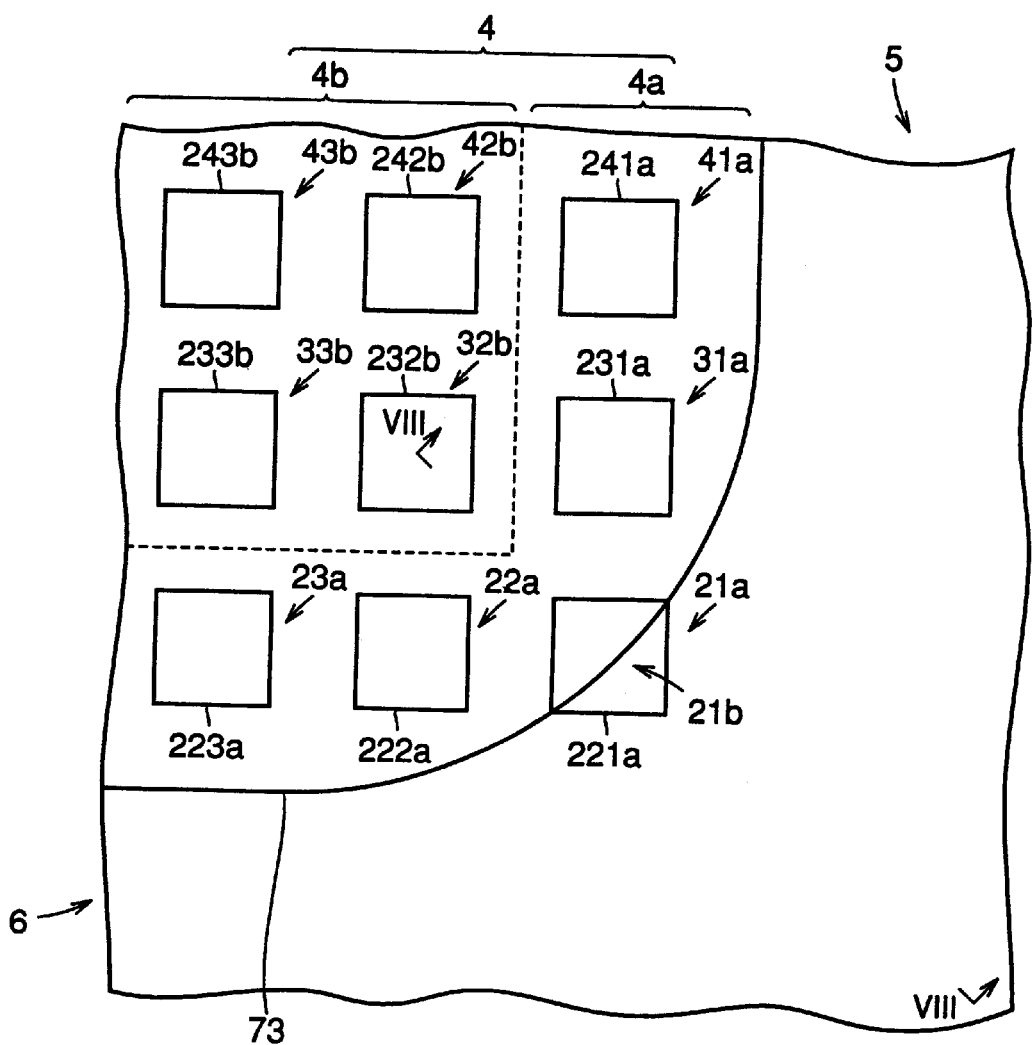
FIG. 7 is a top plan view showing the second step of a manufacturing method of the semiconductor device shown in FIGS. 3 and 4.
Figure 8:
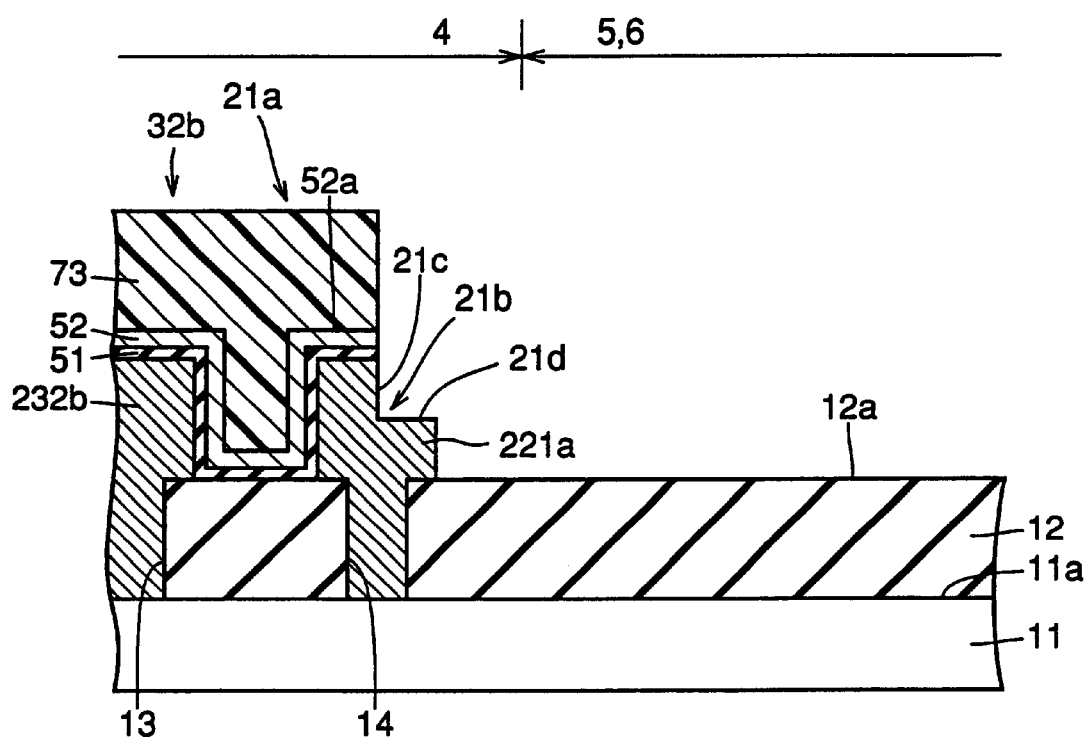
FIG. 8 is a cross sectional view taken along the line VIII—VIII in FIG. 7.

Referring to FIGS. 7 and 8, using resist pattern 73 as a mask, doped polysilicon film 82 and silicon nitride oxide film 81 are etched with the mixed gas of $Cl_2$, $SF_6$ and He, to form an upper electrode 52 and a dielectric film 51.

Capacitors 21a, 22a, 23a, 31a, 32b, 33b, 41a, 42b and 43b are thus formed. At the same time, lower electrode 221a is also etched to form a notch 21b which has a side surface 21c and a bottom surface 21d.

Figure 9:
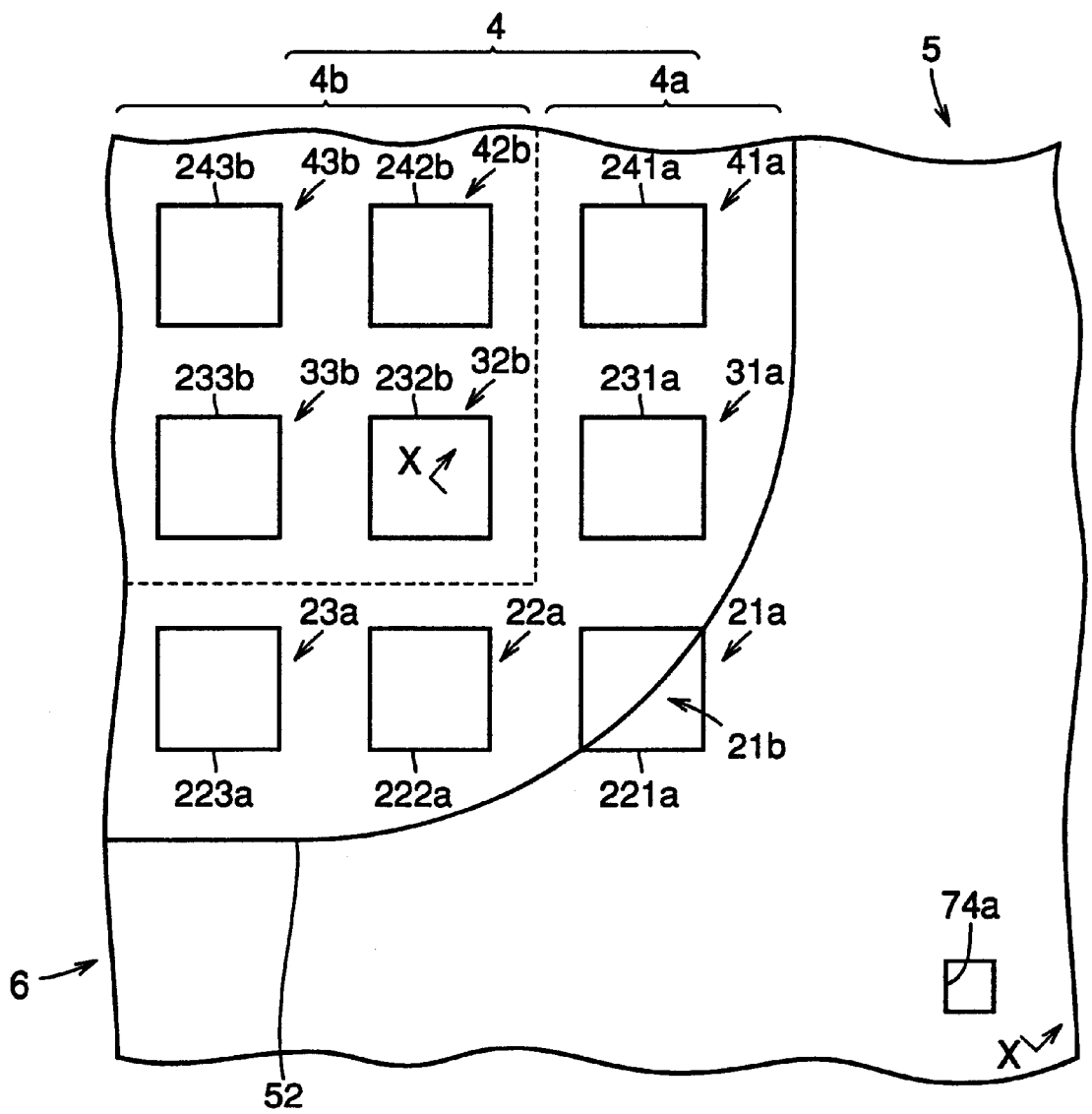
FIG. 9 is a top plan view showing the third step of a manufacturing method of the semiconductor device shown in FIGS. 3 and 4.
Figure 10:
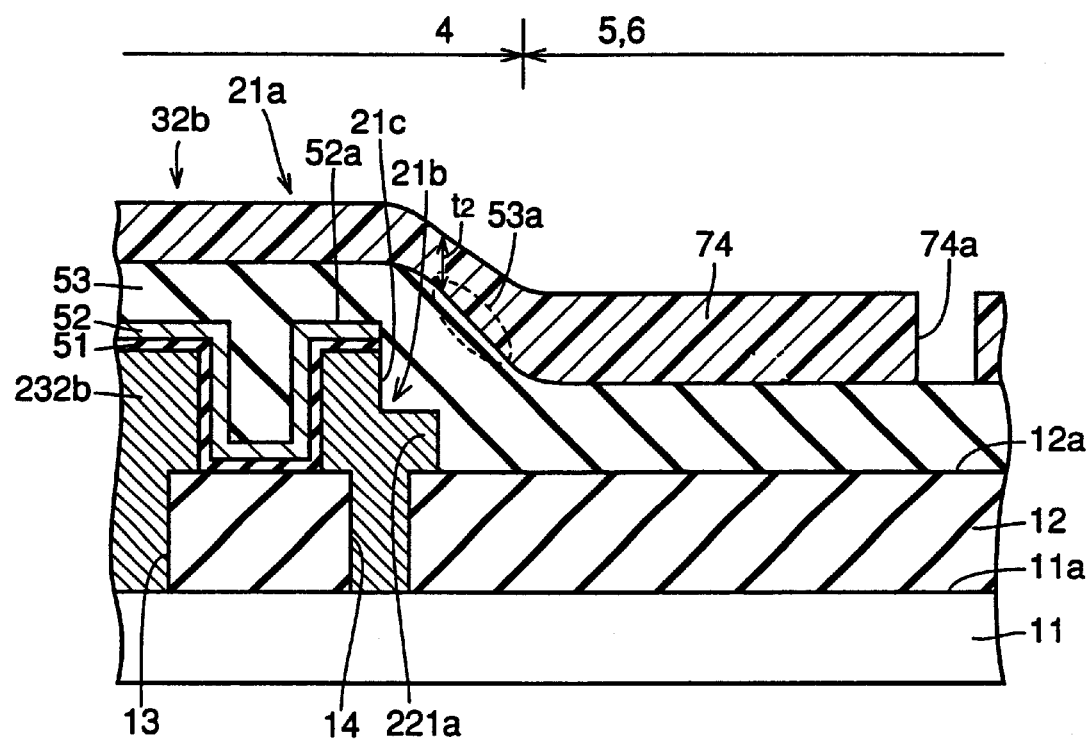
FIG. 10 is a cross sectional view taken along the line X—X in FIG. 9.

Referring to FIGS. 9 and 10, an interlayer insulating film 53 is formed from a silicon oxide film by CVD to cover capacitors 21a, 22a, 23a, 31a, 32b, 33b, 41a, 42b and 43b. At this time, a step 53a is created in interlayer insulating film 53. Interlayer insulating film 53 is coated with a resist, and a resist pattern 74 is formed by patterning this resist into a prescribed shape. Resist pattern 74 has a film thickness ($t_2$ in FIG. 10) of about 500 nm at its thinnest portion.

Figure 11:
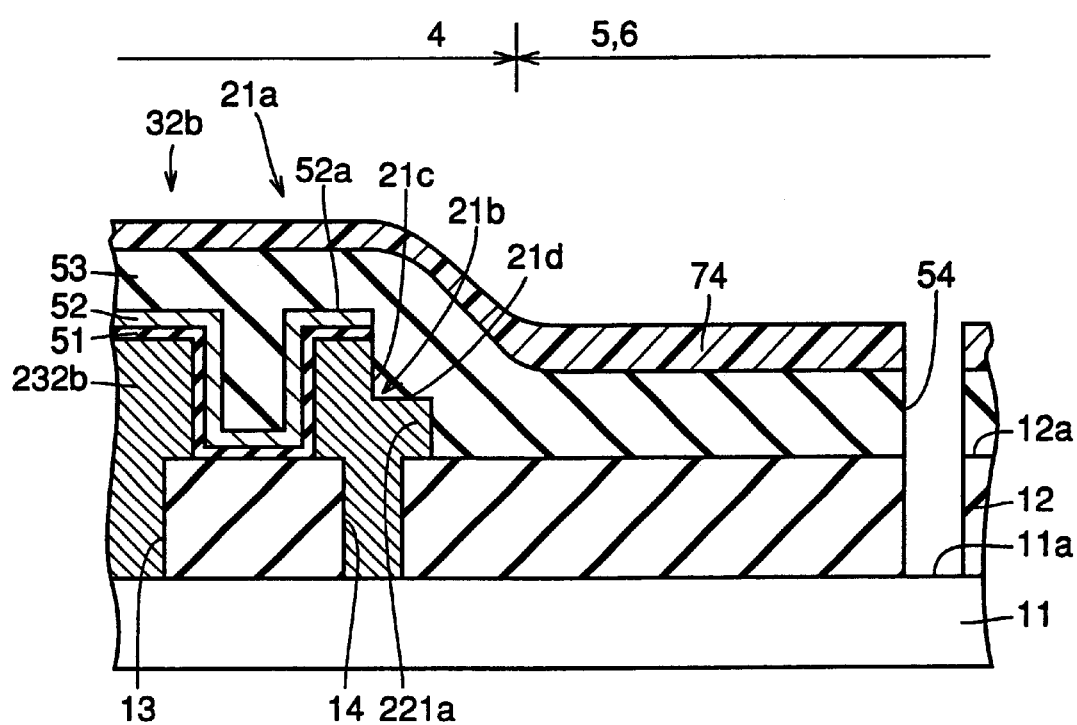
FIG. 11 is a cross sectional view showing the fourth step of a manufacturing method of the semiconductor device shown in FIGS. 3 and 4.

With reference to FIG. 11, a contact hole 54 is formed by etching interlayer insulating films 53 and 12 according to a hole pattern 74a in resist pattern 74.

With reference to FIGS. 3 and 4, doped polysilicon is deposited by CVD on interlayer insulating film 53 to fill in contact hole 54. The doped polysilicon is etched according to a resist pattern formed thereon, so that an interconnection 72 is formed. The semiconductor device as shown in FIGS. 3 and 4 is thus completed.

In the manufacturing method as described above, as shown in FIG. 10, the step 53a in interlayer insulating film 53, on which a resist pattern 74 is formed, has a gradual slope owing to the presence of the notch 21b in capacitor 21a. Accordingly, the minimum film thickness of the resist pattern 74 formed on the step 53a, which is 500 nm, becomes greater than the minimum film thickness $t_1$ (=400 nm) in the prior art. As a result, when etching interlayer insulating films 53 and 12 according to this resist pattern 74, the resist can be kept on step 53a, so that step 53a is prevented from being exposed during etching. The yield of the semiconductor devices can thus be increased.

Note that the notch 21b is formed at the step of forming upper electrode 52 and dielectric film 51, so that an additional manufacturing step is unnecessary.

Second Embodiment

Figure 12:
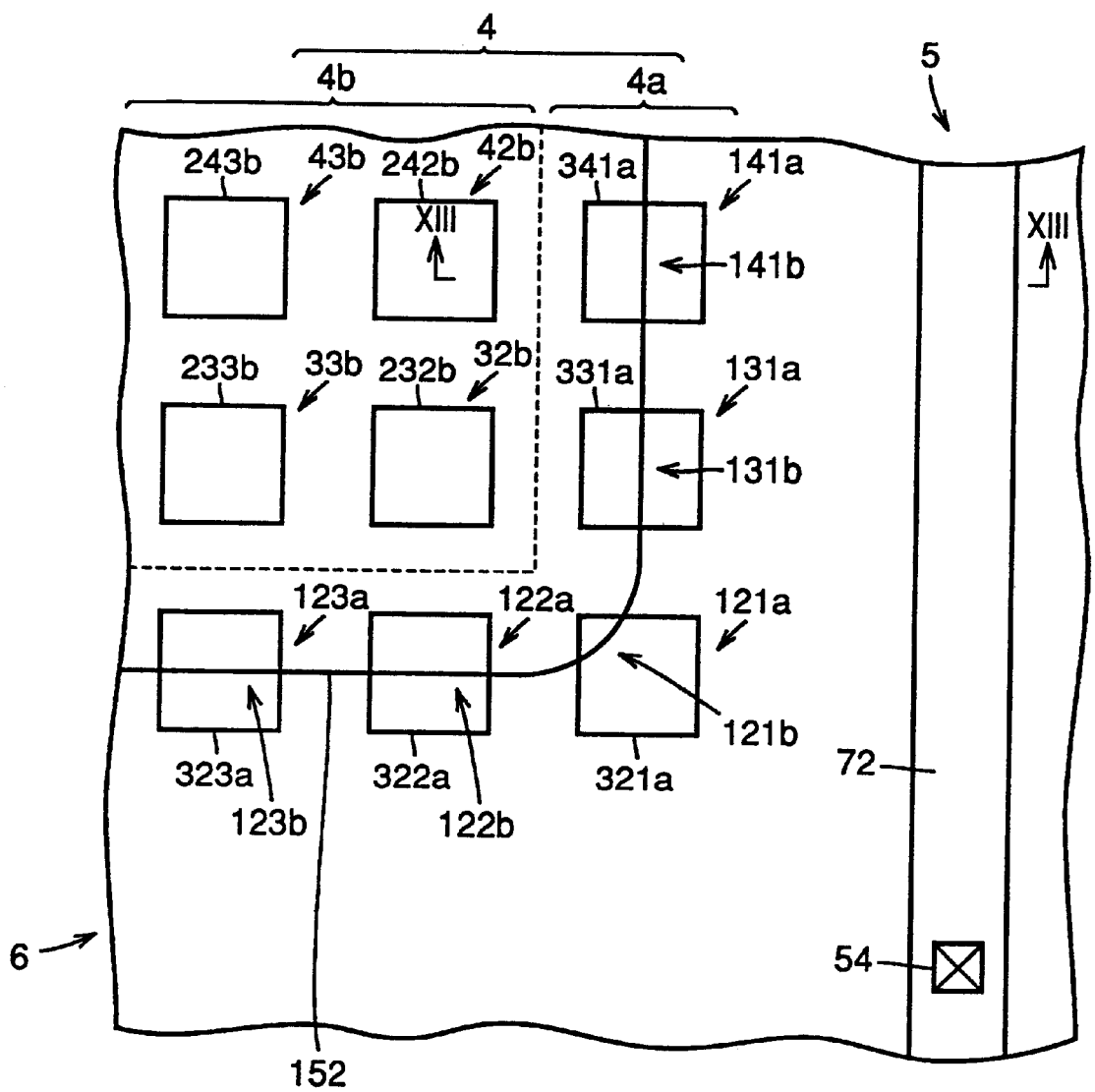
FIG. 12 is a top plan view of a semiconductor device according to a second embodiment of the present invention.

The semiconductor device shown in FIG. 12 is different from the semiconductor device shown in FIG. 3 in that all the capacitors 121a, 122a, 123a, 131a and 141a in dummy capacity region 4a have respective notches 121b, 122b, 123b, 131b and 141b formed in respective lower electrodes 321a, 322a, 323a, 331a and 341a, whereas in the semiconductor device shown in FIG. 3, notches 21b are formed only in lower electrodes 221a of capacitors 21a located at the corners of dummy capacitor region 4a.

The other difference between these two semiconductor devices is that in the device shown in FIG. 12, respective portions of all the lower electrodes of the capacitors located in dummy capacitor region 4a are exposed from upper electrode 152, whereas in the semiconductor device shown in FIG. 3, only portions of lower electrodes 221a located at the corners of dummy capacitor region 4a are exposed from upper electrode 52. Except for these features, the semiconductor device shown in FIG. 12 is identical to the semiconductor device shown in FIG. 3.

Figure 13:
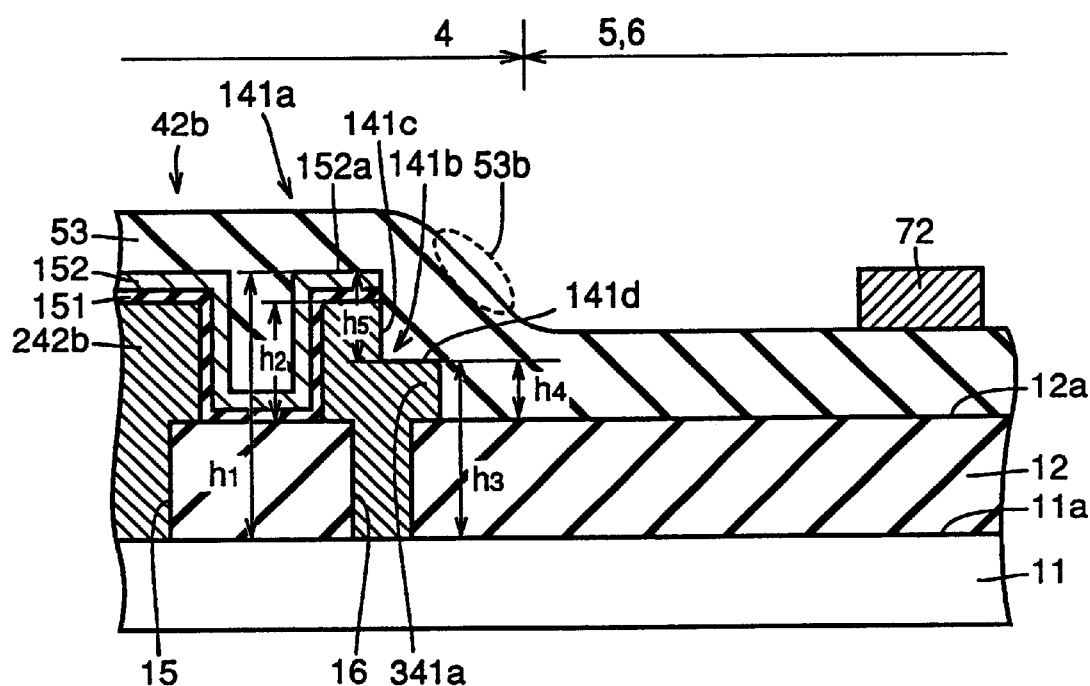
FIG. 13 is a cross sectional view taken along the line XIII—XIII in FIG. 12.

With reference to FIG. 13, an interlayer insulating film 12 is formed on the main surface 11a of silicon substrate 11. Interlayer insulating film 12 is provided with contact holes 15 and 16, and on which holes capacitors 42b and 141a are formed, respectively.

Capacitor 42b consists of a lower electrode 242b, a dielectric film 151 and an upper electrode 152. Lower electrode 242b formed of doped polysilicon is filled in contact hole 15. Dielectric film 151 made of a silicon nitride oxide film covers lower electrode 242b. Upper electrode 152 formed of doped polysilicon covers dielectric film 151.

Capacitor 141a consists of a lower electrode 341a, a dielectric film 151 and an upper electrode 152. Lower electrode 341a formed of doped polysilicon is filled in contact hole 16. Dielectric film 151 covers a portion of lower electrode 341a. Upper electrode 152 covers dielectric film 151 on lower electrode 341a. Upper electrode 152 has an upper surface 152a as a first surface which extends at a first height above the main surface 11a of silicon substrate 11. Dielectric film 151 is about 10 nm thick, and upper electrode 152 is about 100 nm thick.

Capacitor 141a has a notch 141b, which has a side surface 141c contiguous with upper surface 152a, and a bottom surface 141d, contiguous with upper surface 152a, as a second surface which extends at a second height lower than the first height above the main surface 11a of silicon substrate 11. The values of $h_1$, $h_2$, $h_3$, $h_4$ and $h_5$ in FIG. 13 are same as those of $h_1$, $h_2$, $h_3$, $h_4$ and $h_5$ in FIG. 4, respectively.

An interlayer insulating film 53 is formed to cover capacitors 42b and 141a. In interlayer insulating film 53, there exists a step 53b above notch 141b. An interconnection layer 72 is formed on interlayer insulating film 53.

The semiconductor device configured as described above offers the effects similar to the semiconductor device shown in FIGS. 3 and 4. In addition, the semiconductor device in this embodiment offers an effect that the slope of the step created at dummy capacitor region 4a is made even less steep because all the lower electrodes of the capacitors in dummy capacitor region 4a have respective notches formed therein.

A manufacturing method of the semiconductor device shown in FIGS. 12 and 13 will now be described.

Figure 14:
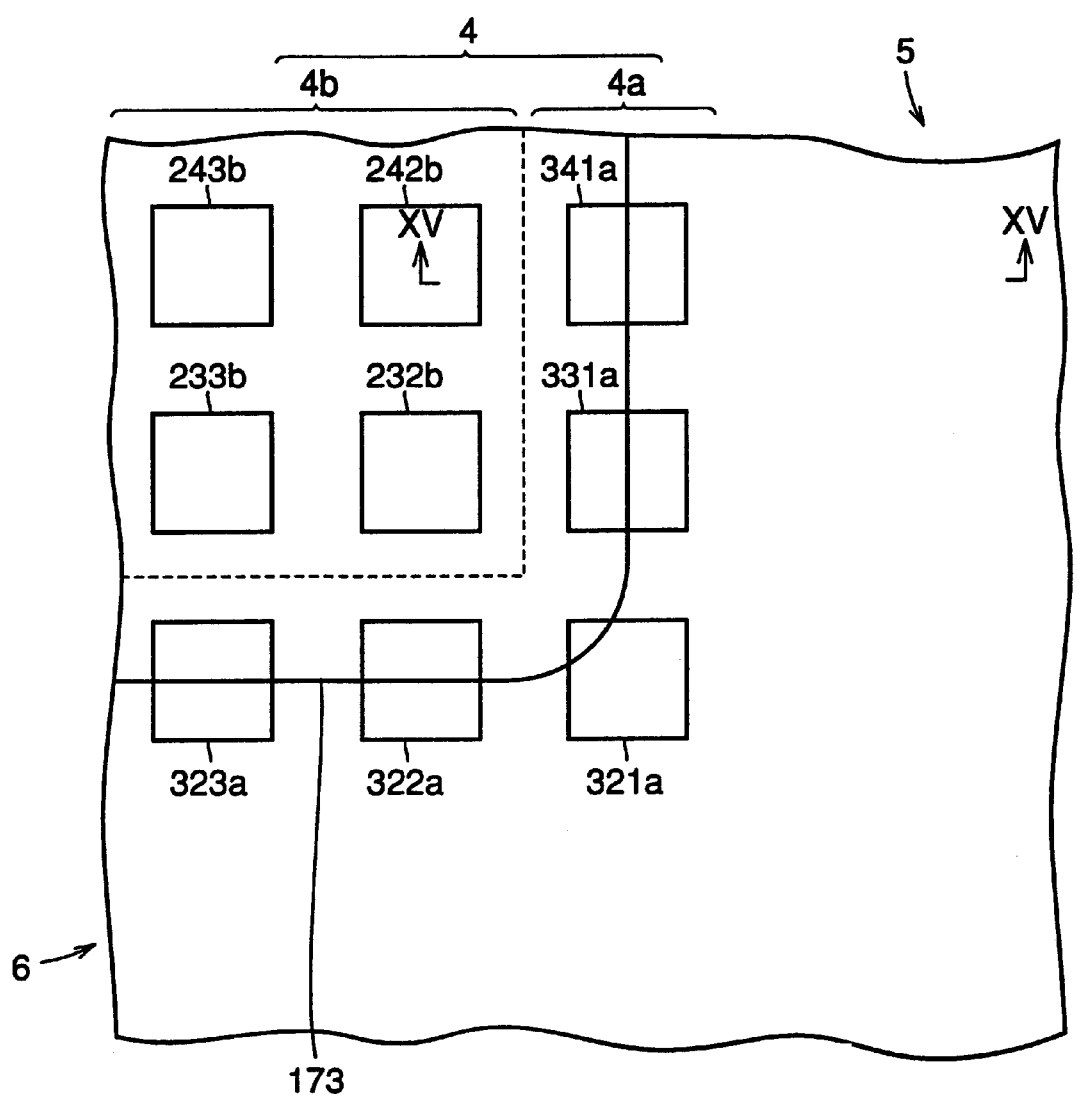
FIG. 14 is a top plan view showing the first step of a manufacturing method of the semiconductor device shown in FIGS. 12 and 13.
Figure 15:
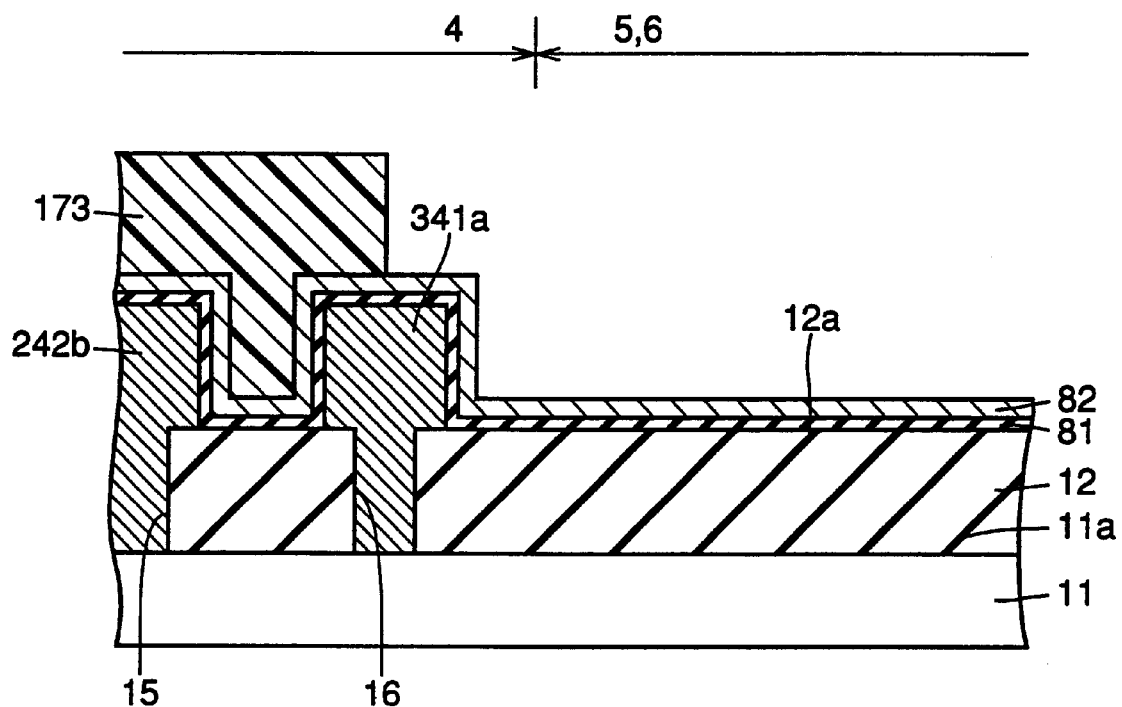
FIG. 15 is a cross sectional view taken along the line XV—XV in FIG. 14.

Referring to FIGS. 14 and 15, MOS transistors (not shown) are formed on the main surface 11a of silicon substrate 11, and on the MOS transistors, an interlayer insulating film 12 is formed by CVD, which is made of a silicon oxide film. Interlayer insulating film 12 is etched according to a resist pattern formed thereon, and contact holes 15 and 16 are thus formed.

Doped polysilicon is deposited by CVD to fill in contact holes 15 and 16 as well as to cover the main surface 12a of interlayer insulating film 12. A resist pattern is formed on this doped polysilicon, and the doped polysilicon is etched according to this resist pattern to form lower electrodes 321a, 322a, 323a, 331a, 232b, 233b, 341a, 242b and 243b.

A silicon nitride oxide film 81 is formed by CVD to cover these lower electrodes 321a, 322a, 323a, 331a, 232b, 233b, 341a, 242b ad 243b. Formed to cover silicon nitride oxide film 81 by CVD is a doped polysilicon film 82, on which a resist pattern 173 is formed.

Figure 16:
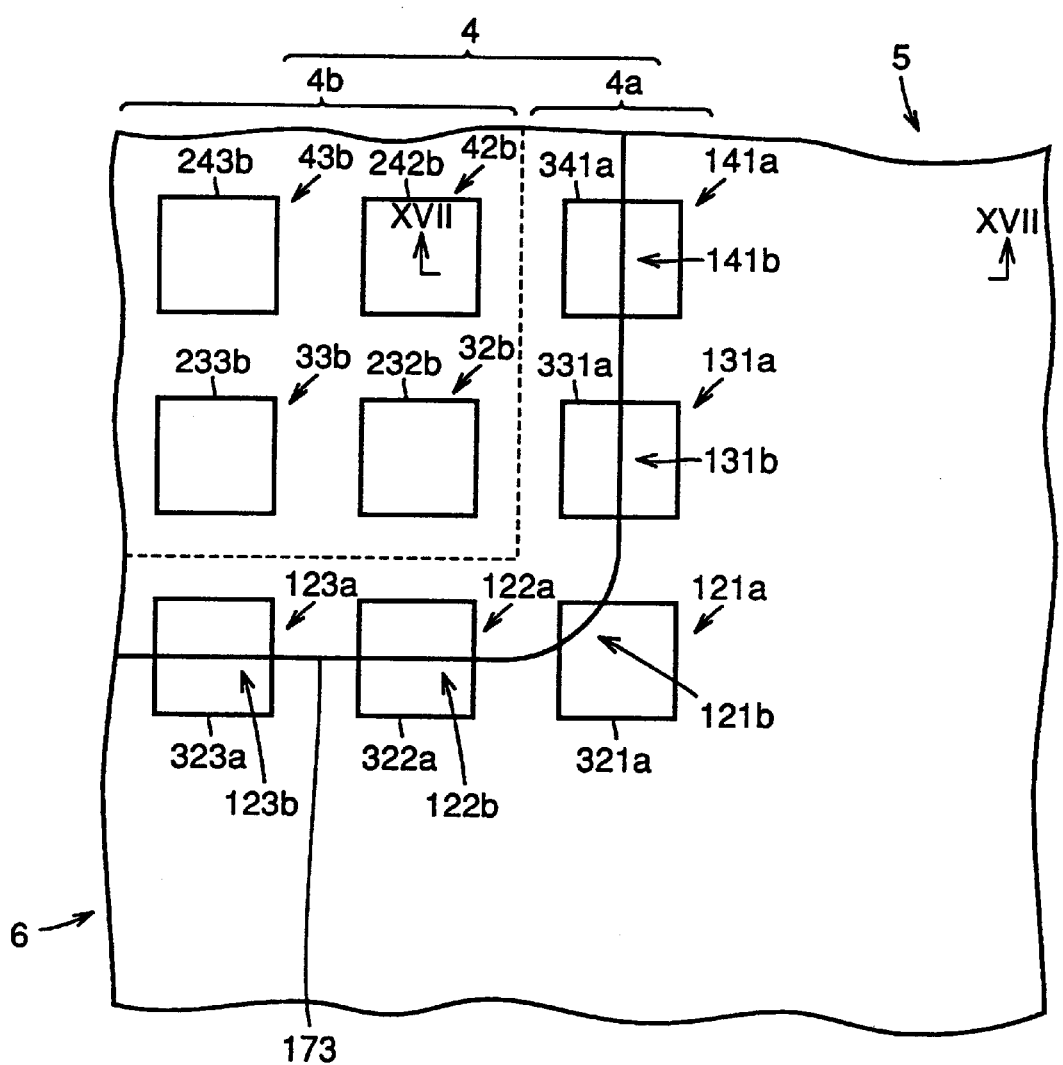
FIG. 16 is a top plan view showing the second step of a manufacturing method of the semiconductor device shown in FIGS. 12 and 13.
Figure 17:
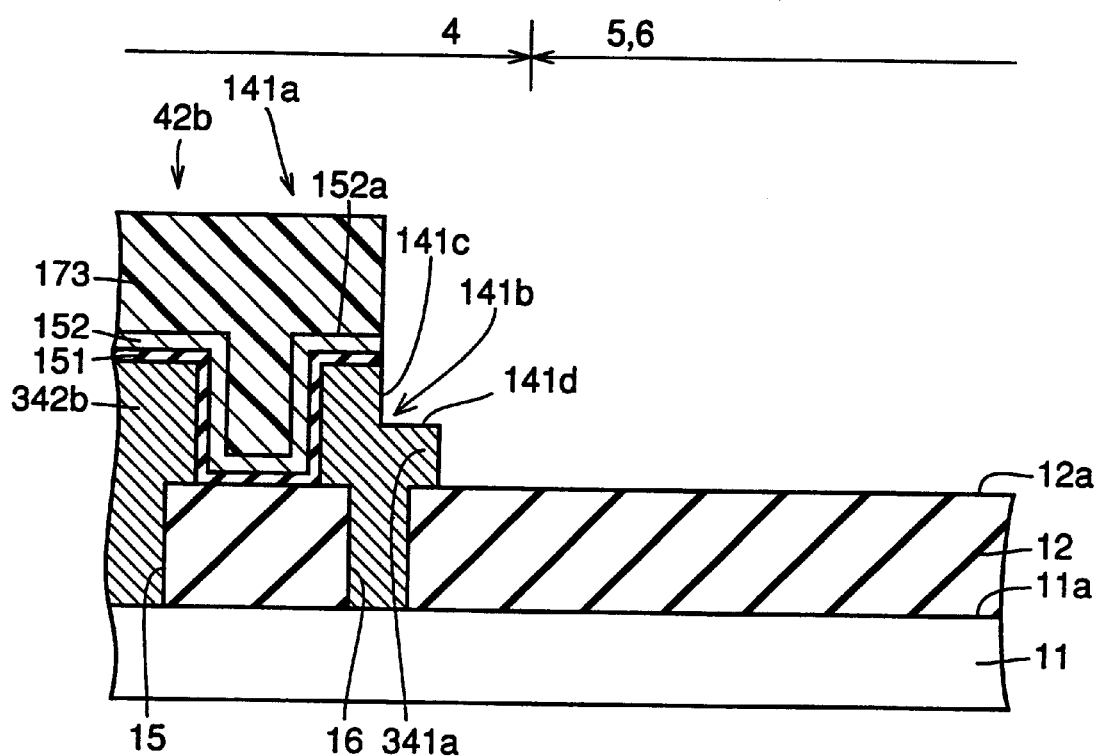
FIG. 17 is a cross sectional view taken along the line XVII—XVII in FIG. 16.

With reference to FIGS. 16 and 17, doped polysilicon film 82 and silicon nitride oxide film 81 are etched with the mixed gas of $Cl_2$, $SF_6$ and He using resist pattern 173 as a mask, whereby an upper electrode 152 and a dielectric film 151 are formed, and hence capacitors 121a, 122a, 123a, 131a, 32b, 33b, 141a, 42b and 43b are formed. At the same time, lower electrode 341a is etched to form a notch 141b having a side surface 141c and a bottom surface 141d. Similarly, lower electrodes 321a, 322a, 323a and 331a are etched to form respective notches 121b, 122b, 123b and 131b therein.

Figure 18:
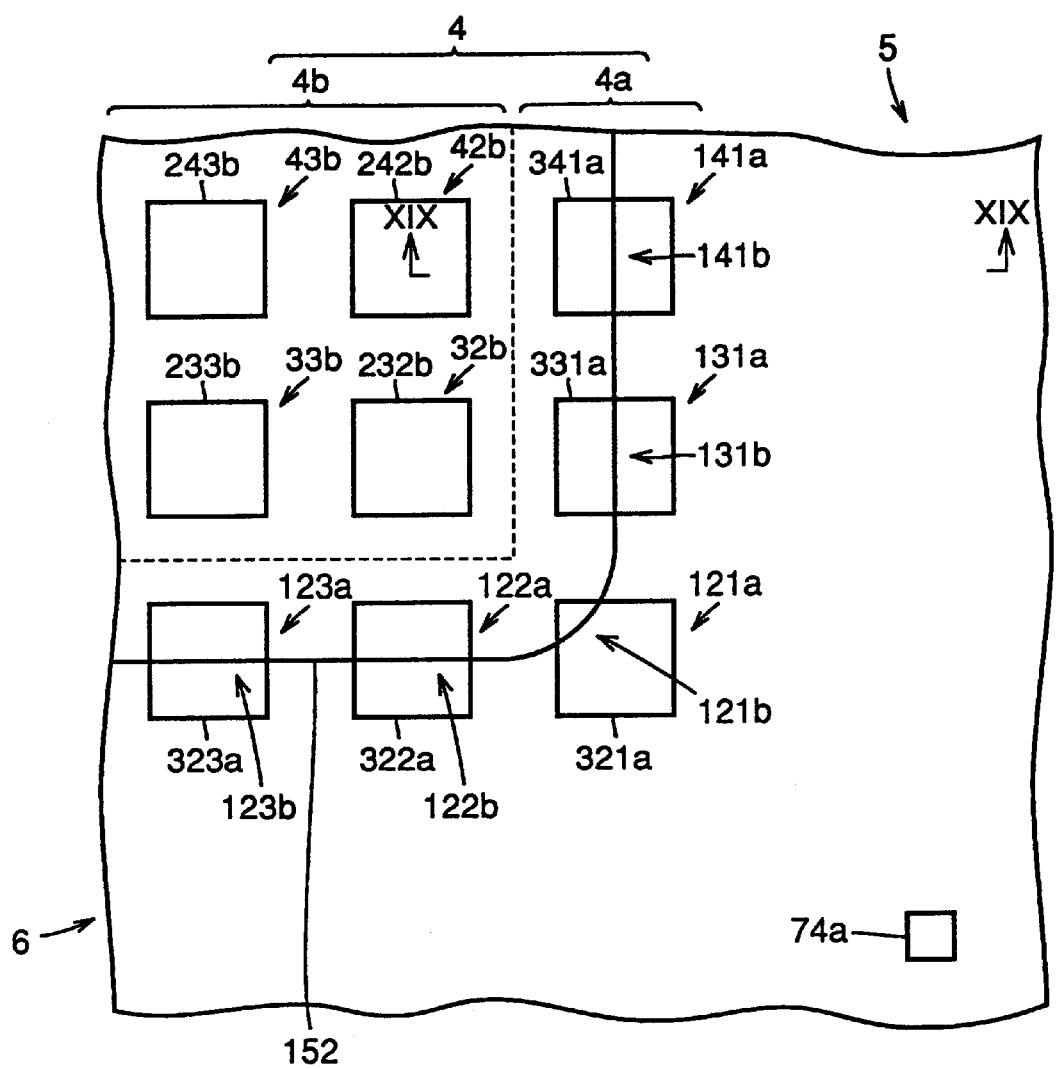
FIG. 18 is a top plan view showing the third step of a manufacturing method of the semiconductor device shown in FIGS. 12 and 13.
Figure 19:
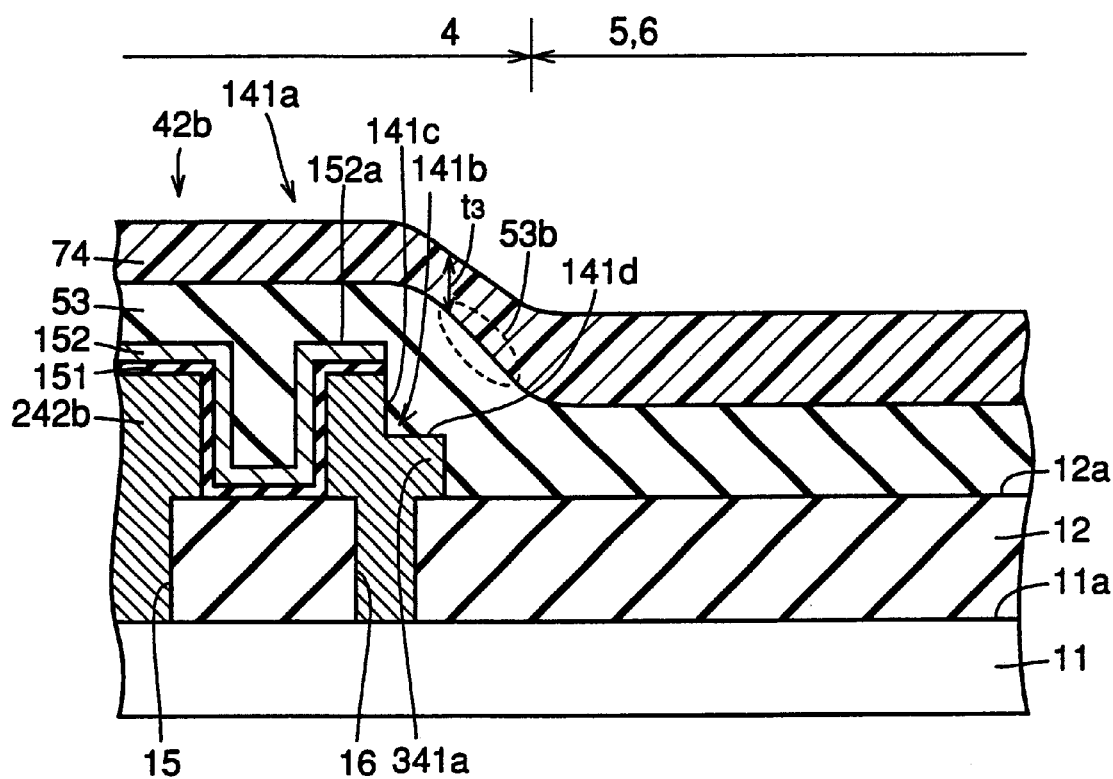
FIG. 19 is a cross sectional view taken along the line XIX—XIX in FIG. 18.
Figure 20:
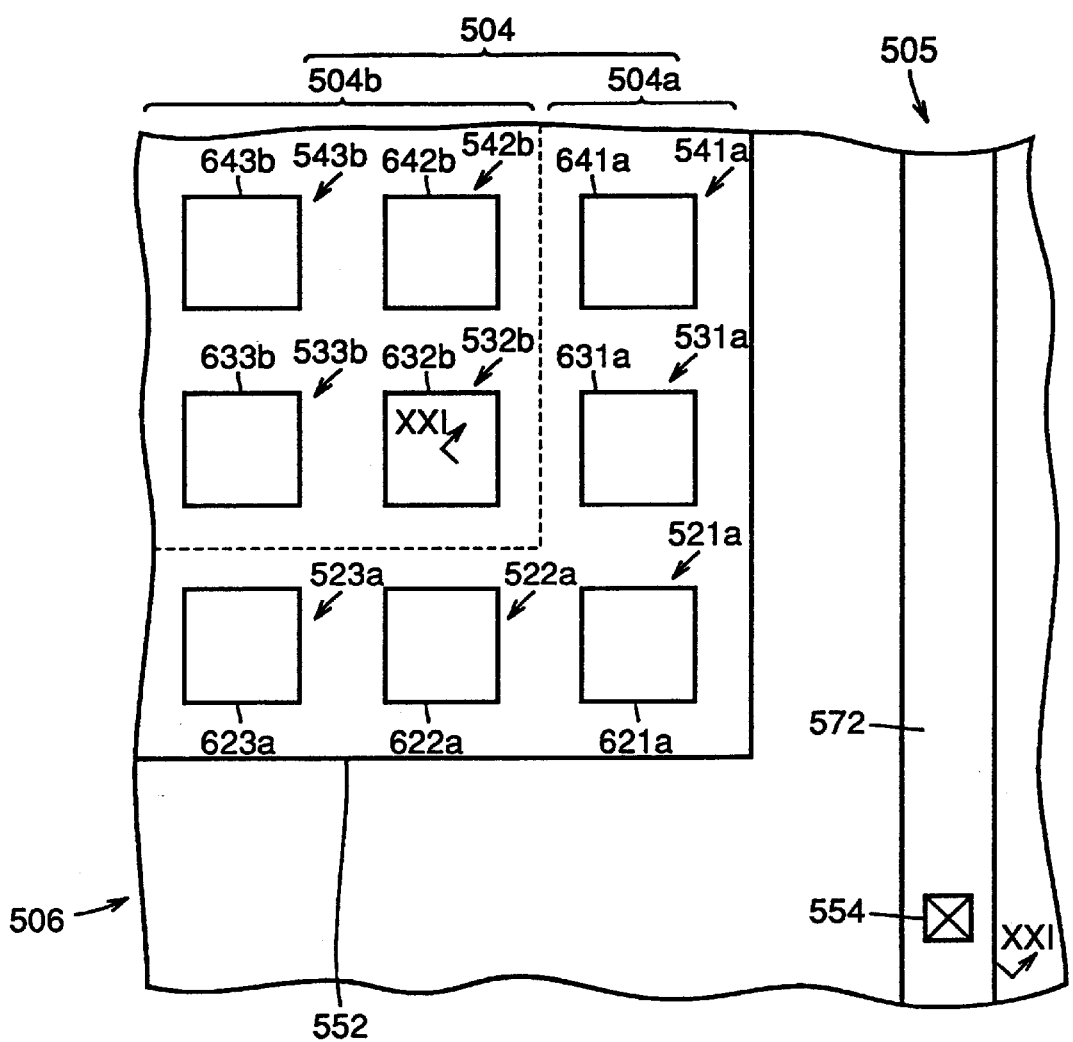
FIG. 20 is a top plan view showing a configuration of a conventional semiconductor device.
Figure 21:
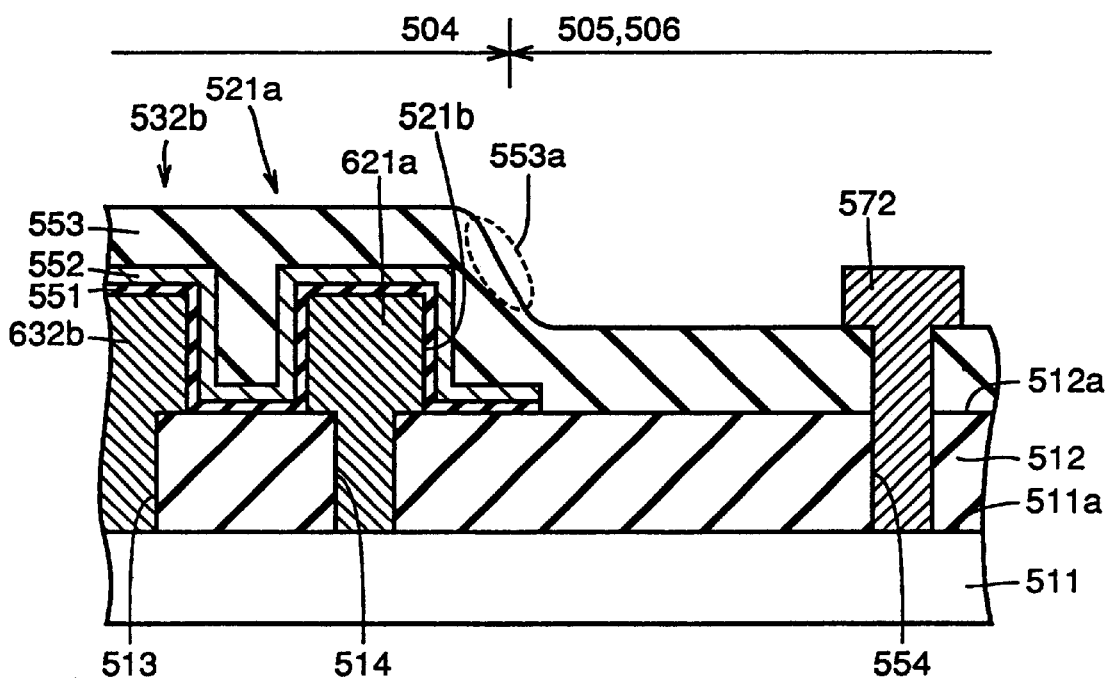
FIG. 21 is a cross sectional view taken along the line XXI—XXI in FIG. 20.
Figure 22:
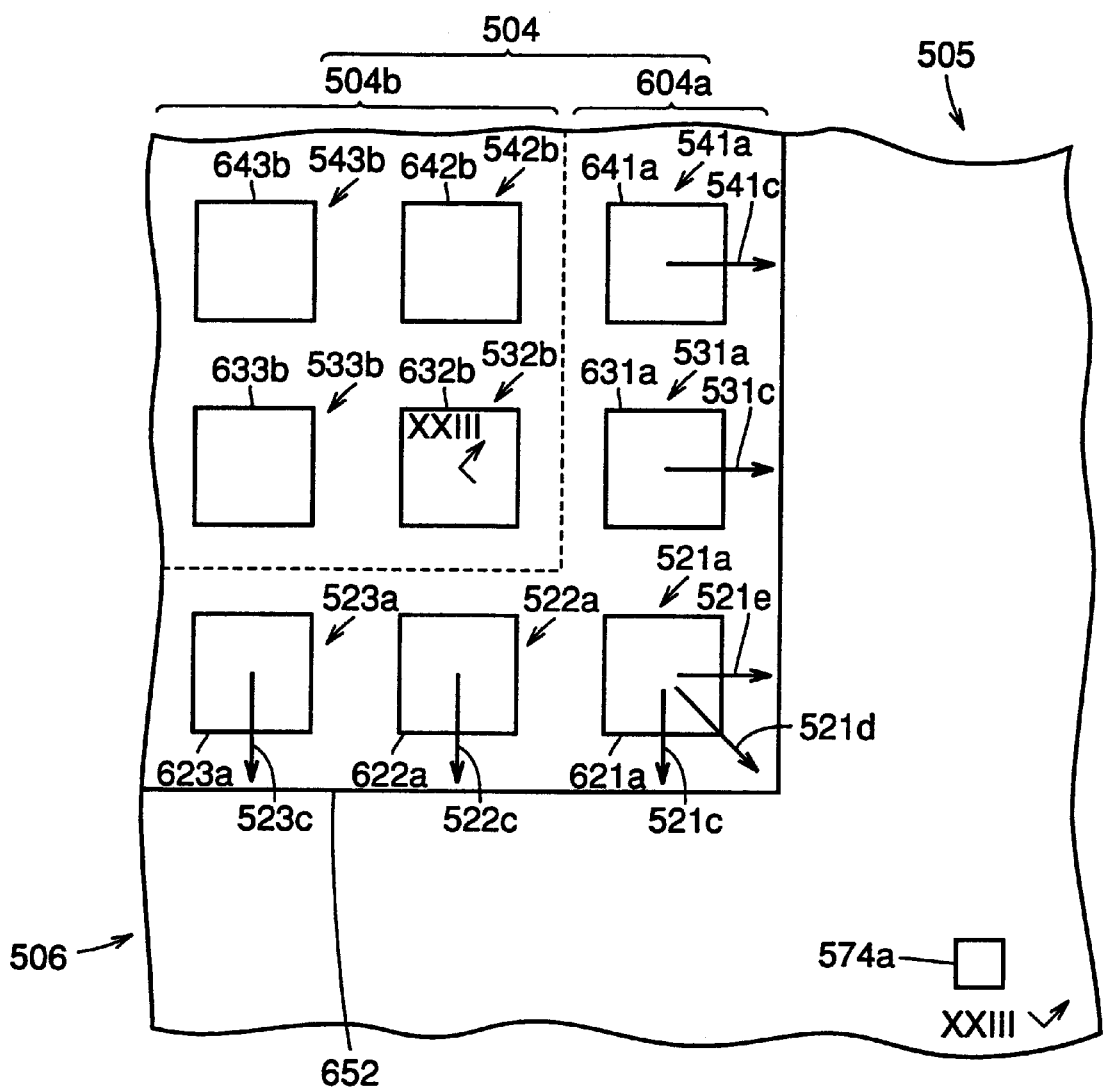
FIG. 22 is a top plan view showing a manufacturing process of the conventional semiconductor device shown in FIGS. 20 and 21.
Figure 23:
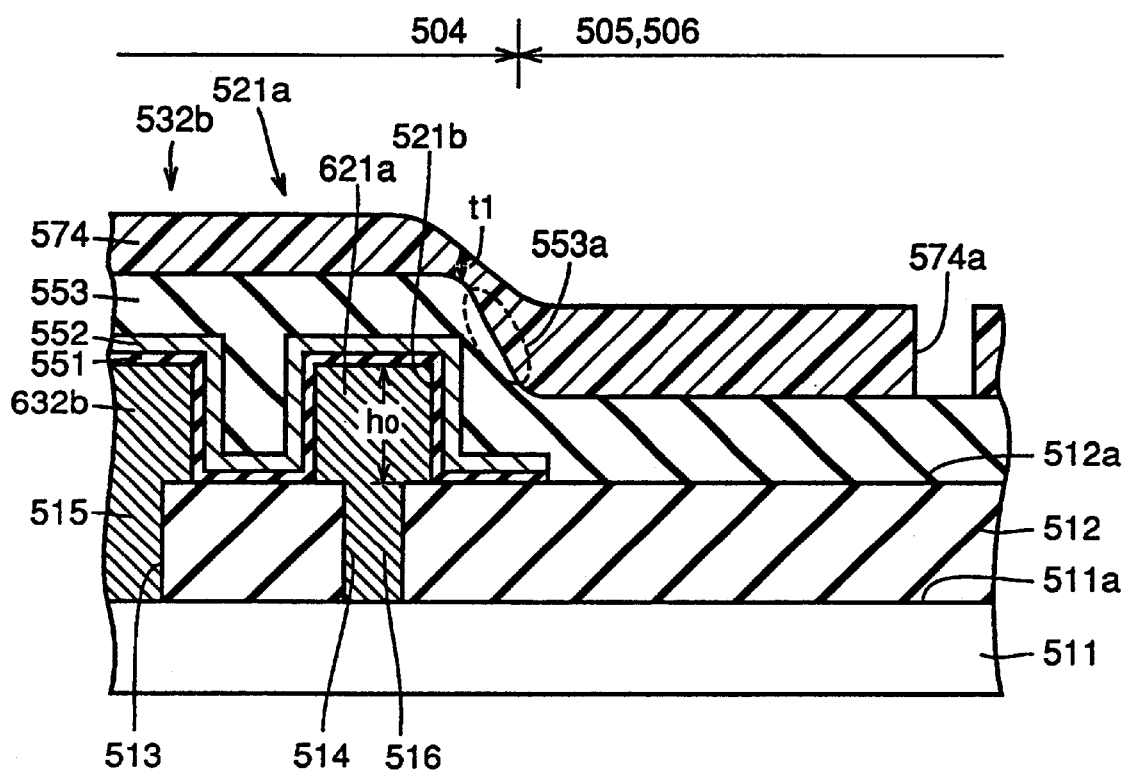
FIG. 23 is a cross sectional view taken along the line XXIII—XXIII in FIG. 22.
Figure 24:
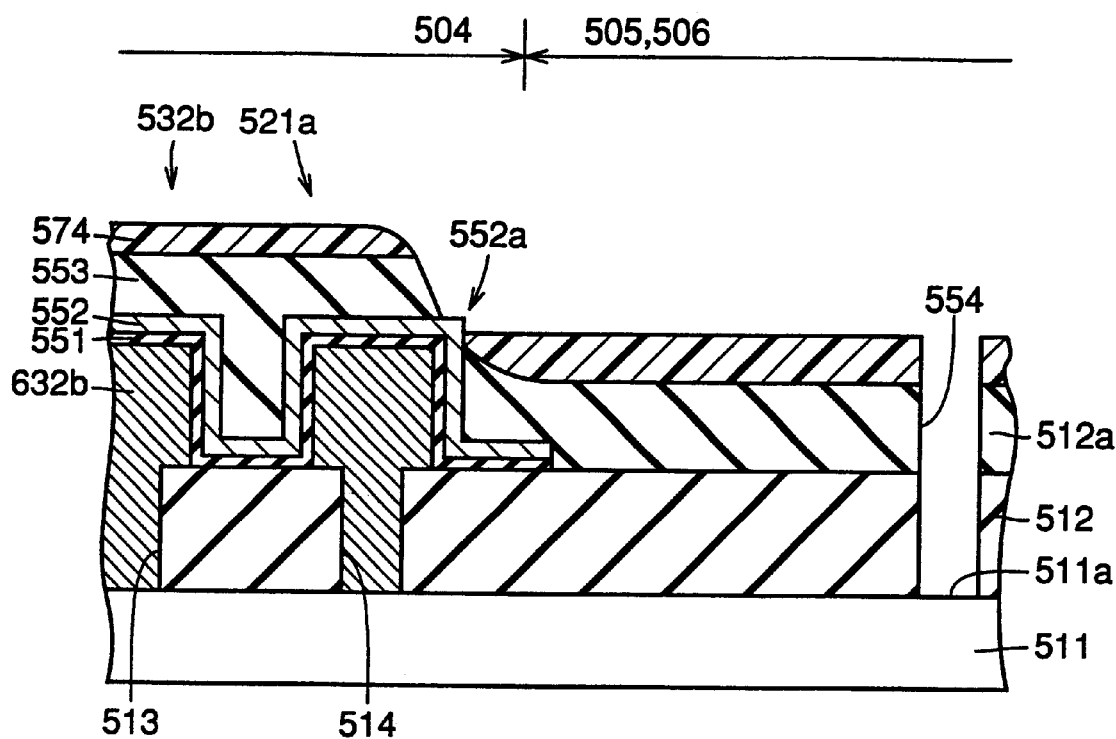
FIG. 24 illustrates a problem that will occur in a manufacturing method of a conventional semiconductor device.

Referring to FIGS. 18 and 19, an interlayer insulating film 53 is formed from a silicon oxide film by CVD to cover capacitors 121a, 122a, 123a, 131a, 32b, 33b, 141a, 42b and 43b. At this time, a step 53b is created in interlayer insulating film 53. To cover interlayer insulating film 53, a resist pattern 74 is formed by coating and patterning a resist into a prescribed form. Resist pattern 74 has the thinnest portion above notch 141b, and the thickness $t_3$ of resist pattern 74 in this portion is about 500 nm.

With reference to FIGS. 12 and 13, interlayer insulating films 53 and 12 are etched according to resist pattern 74 to form a contact hole 54. Doped polysilicon is deposited by CVD to fill in contact hole 54 and to cover interlayer insulating film 53. The doped polysilicon is etched according to a resist pattern formed thereon, so that an interconnection layer 72 is formed. The semiconductor device shown in FIGS. 12 and 13 is thus completed.

According to the manufacturing process as described above, step 53b is prevented from being exposed during etching since resist pattern 74 is ensured to have a sufficient thickness, whereby the decrease in the yield of the semiconductor devices is avoided, which is similar to the case of the first embodiment. Moreover, an additional manufacturing step is unnecessary also as in the first embodiment.

The embodiments of the present invention have thus been described, although various modifications are possible for these embodiments discussed herein. For example, each film thickness may be altered as required. The form of the capacitor in dummy capacitor region 4a, which has been described as having a stairlike pattern in the first and second embodiments, may instead have a sloped pattern.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate having a main surface;
   a memory cell array region having a plurality of capacitors formed on the main surface of said semiconductor substrate; and
   a peripheral region surrounding said memory cell array region;

wherein, of said plurality of capacitors, a lower electrode of a capacitor in said memory cell array region adjacent said peripheral region includes a first portion having a first height above the main surface of said semiconductor substrate and a second portion contiguous with said first portion and having a second height lower than the first height above the main surface of said semiconductor substrate, and wherein the second portion extends approximately in the same direction as the main surface of the semiconductor substrate.

2. The semiconductor device according to claim 1, further comprising an interlayer insulating film covering said first and second portions of said capacitor.

3. The semiconductor device according to claim 1, wherein said plurality of capacitors are arranged in a matrix, and said capacitor in said memory cell array region adjacent to said peripheral region is located at a corner of said matrix.

4. The semiconductor device according to claim 1, wherein said memory cell array region includes a capacitor region involved in storing information and a dummy capacitor region surrounding said capacitor region taking no part in storing information, and said capacitor in said memory cell array region adjacent said peripheral region is formed in said dummy capacitor region.

5. The semiconductor device according to claim 1, wherein a dielectric film is formed on said lower electrode and an upper electrode is formed on said dielectric film.

6. A manufacturing method of a semiconductor device having a memory cell array region and a peripheral region surrounding said memory cell array region, comprising the steps of:

forming a plurality of lower electrodes on the main surface of said semiconductor substrate;

forming a dielectric film on the surface of said plurality of lower electrodes;

forming a conductive film on the surface of said dielectric film;

etching said conductive film and said dielectric film to form a plurality of capacitors each including said lower electrode, said dielectric film left on the surface of said lower electrode, and an upper electrode formed on the surface of the dielectric film left on the surface of said lower electrode, and having a first portion extending at a first height above the main surface of said semiconductor substrate; and etching said lower electrode of a capacitor adjacent the peripheral region to form in said lower electrode a second portion contiguous with said first portion and extending at a second height lower than said first height above the main surface of said semiconductor substrate.

7. The manufacturing method of a semiconductor device according to claim 6, further comprising the step of forming an interlayer insulating film covering said capacitor in said memory cell array region adjacent to said peripheral region.

8. The manufacturing method of a semiconductor device according to claim 7, further comprising the steps of forming a resist pattern on said interlayer insulating film and of etching said interlayer insulating film according to said resist pattern.

9. The semiconductor device according to claim 5, wherein an upper portion of the lower electrode has a first section and a second section, wherein the upper electrode overlies the first section of the lower electrode, wherein the first height is a distance from an upper surface of the upper electrode to the main surface of the semiconductor substrate, and wherein the second height is a distance from an upper surface of the second section of the lower electrode to the main surface of the semiconductor substrate.

10. The semiconductor device according to claim 5, wherein a first section of the lower electrode has an upper surface that is higher than an upper surface of a second section of the lower electrode, as measured from the main surface of the semiconductor substrate.

11. A semiconductor device, comprising:

a semiconductor substrate;

a memory cell array region having a plurality of capacitors formed on the semiconductor substrate; and a peripheral region surrounding the memory cell array region;

wherein a capacitor adjacent the peripheral region includes a lower electrode having a notched portion opposite the peripheral region and an unnotched portion, a dielectric film formed on the unnotched portion of the lower electrode, and an upper electrode formed on the dielectric layer.

12. The semiconductor device according to claim 11, further comprising an interlayer insulating film covering the capacitor adjacent the peripheral region.

13. The semiconductor device according to claim 11, wherein the plurality of capacitors forming the memory cell array region are arranged in a matrix and wherein the capacitor adjacent the peripheral region is disposed at a corner of the matrix.

14. The semiconductor device according to claim 11, wherein the plurality of capacitors are arranged in a matrix forming a central memory storage region and a peripheral dummy capacitor region, wherein capacitors in the dummy capacitor region do not store information, and wherein said capacitor adjacent the peripheral region is disposed in the dummy capacitor region.

* * * * *